United States Patent
Kawaguchi et al.

(10) Patent No.: US 10,607,810 B2
(45) Date of Patent: Mar. 31, 2020

(54) VIBRATION CONTROL SYSTEM AND OPTICAL EQUIPMENT EQUIPPED THEREWITH

(71) Applicant: NuFlare Technology, Inc., Yokohama-shi (JP)

(72) Inventors: Michihiro Kawaguchi, Mishima (JP); Kiminobu Akeno, Yokohama (JP); Kiyoshi Nakaso, Sunto-gun (JP); Keita Ideno, Yokosuka (JP); Shintaro Yamamoto, Fujisawa (JP); Keisuke Goto, Kamakura (JP); Hitoshi Matsushita, Inzai (JP); Hirokazu Yoshioka, Tokyo (JP); Ryouta Inoue, Inzai (JP); Yuuki Fukuda, Inzai (JP)

(73) Assignee: NuFlare Technology, Inc., Yokohama-shi (JP)

( * ) Notice: Subject to any disclaimer, the term of this patent is extended or adjusted under 35 U.S.C. 154(b) by 0 days.

(21) Appl. No.: 16/237,775

(22) Filed: Jan. 2, 2019

(65) Prior Publication Data
US 2019/0214224 A1    Jul. 11, 2019

(30) Foreign Application Priority Data
Jan. 5, 2018    (JP) .................................. 2018-000663

(51) Int. Cl.
*H01J 37/244*    (2006.01)
*H01J 37/317*    (2006.01)
*H01J 37/06*    (2006.01)

(52) U.S. Cl.
CPC ............ *H01J 37/244* (2013.01); *H01J 37/06* (2013.01); *H01J 37/3174* (2013.01); *H01J 2237/0216* (2013.01); *H01J 2237/20264* (2013.01)

(58) Field of Classification Search
USPC ...................................................... 250/442.11
See application file for complete search history.

(56) References Cited

U.S. PATENT DOCUMENTS 4,780,739 A  * 10/1988  Kawakami ........... G02B 27/646
                                                              348/208.99
6,522,388 B1 *  2/2003  Takahashi ............... F16F 15/02
                                                                  248/550

(Continued)

FOREIGN PATENT DOCUMENTS

JP          2003-318080       11/2003
JP          2013-26150         2/2013

*Primary Examiner* — Phillip A Johnston
(74) *Attorney, Agent, or Firm* — Oblon, McClelland, Maier & Neustadt, L.L.P.

(57) ABSTRACT

The vibration control system configured to control vibration of a vibration-controlled object is disclosed. The vibration control system comprises: (i) actuator units each including a piezoelectric element configured to expand and contract; (ii) a drive power source configured to supply drive voltages to the piezoelectric elements of the actuator units for causing the piezoelectric elements to expand and contract; (iii) a vibration detector configured to detect a status of vibration of the vibration-controlled object; and (iv) a vibration controller configured to control the vibration of the vibration-controlled object by controlling the voltages supplied by the drive power source to the piezoelectric elements of the actuator units based on the status of vibration detected by the vibration detector, respectively.

16 Claims, 7 Drawing Sheets

(56) References Cited

U.S. PATENT DOCUMENTS

| | | | | |
|---|---|---|---|---|
| 8,456,772 B2* | 6/2013 | Ashizawa | ................ | G02B 7/08 310/317 |
| 2009/0153832 A1* | 6/2009 | Tatsuzaki | ................ | G03F 7/709 355/72 |

* cited by examiner

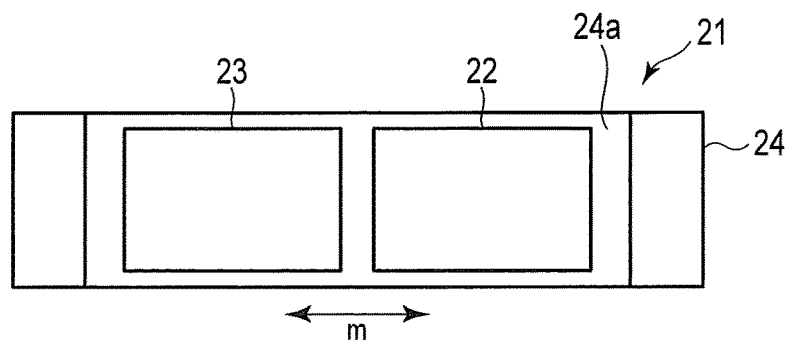
F I G. 5
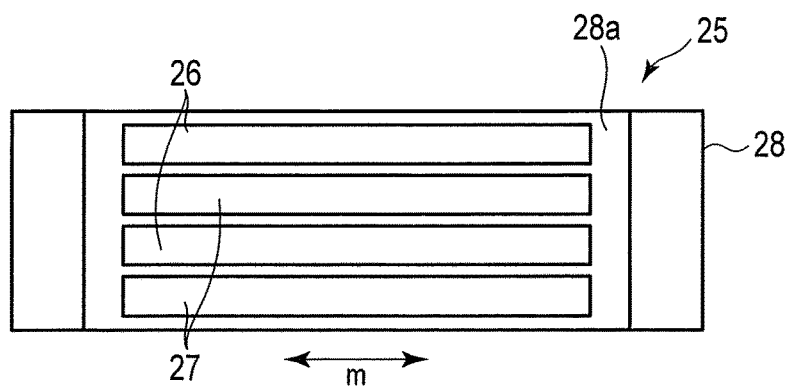
F I G. 6
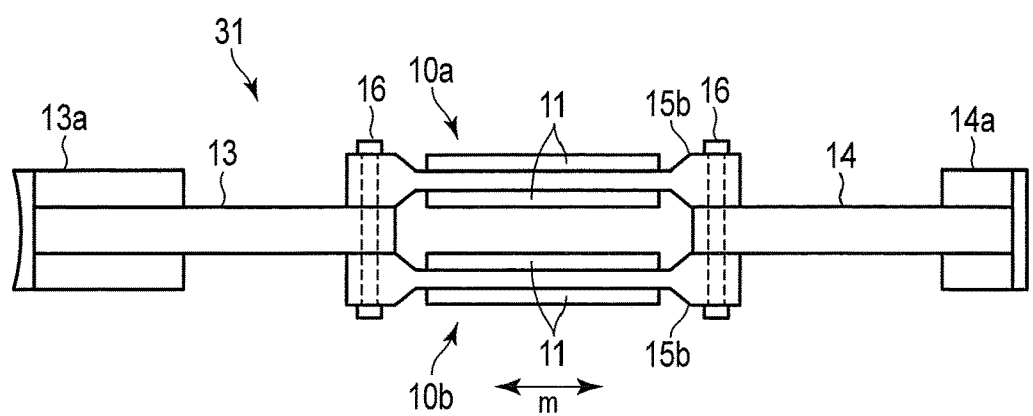
F I G. 7

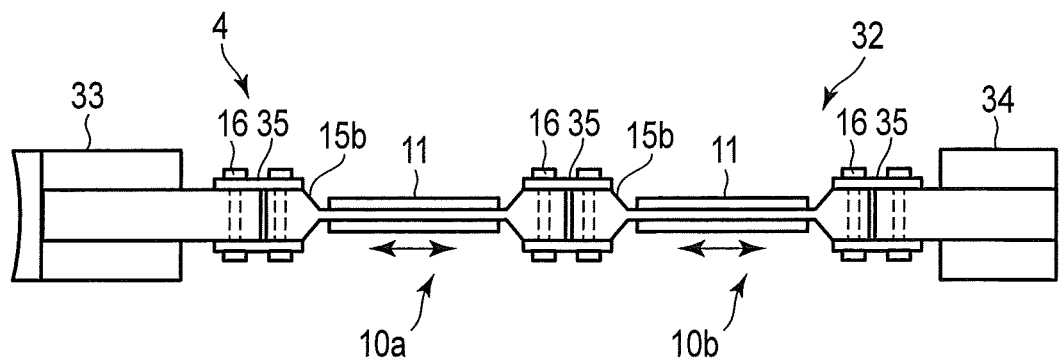
F I G. 8
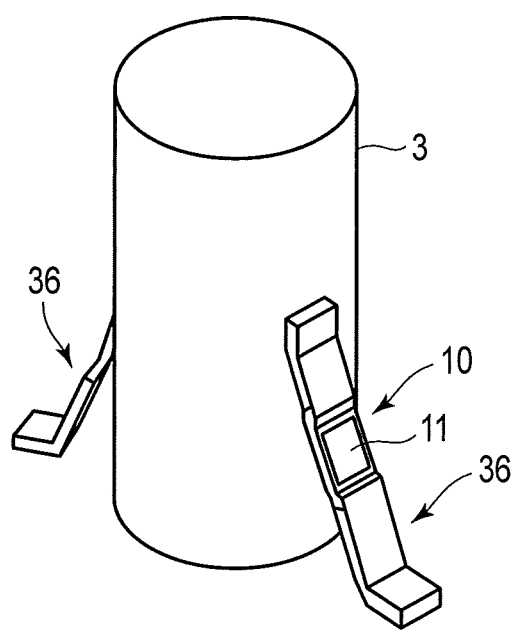
F I G. 9

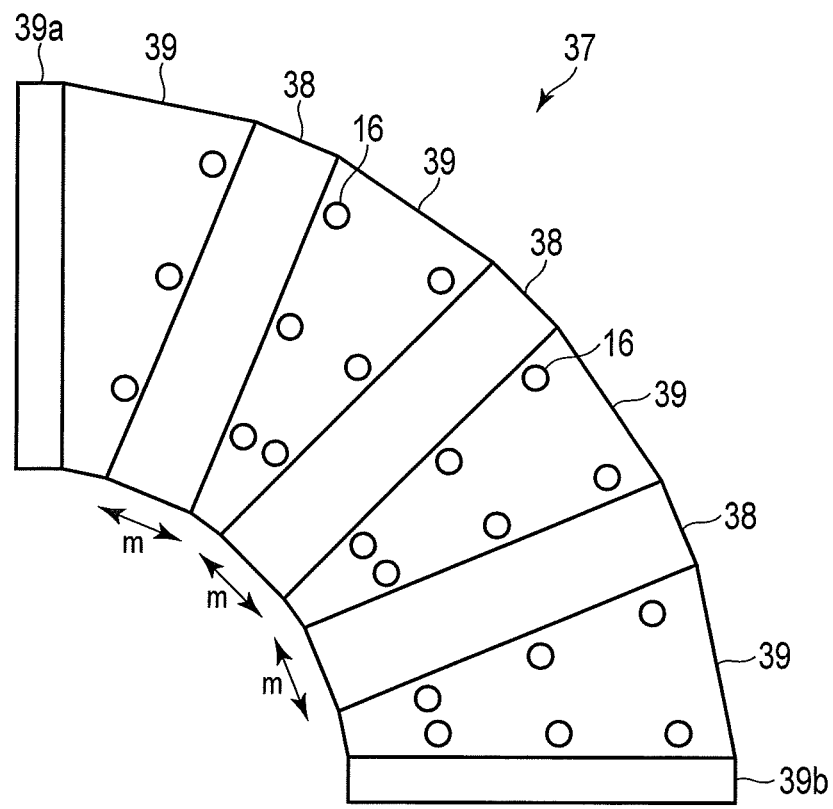
F I G. 10

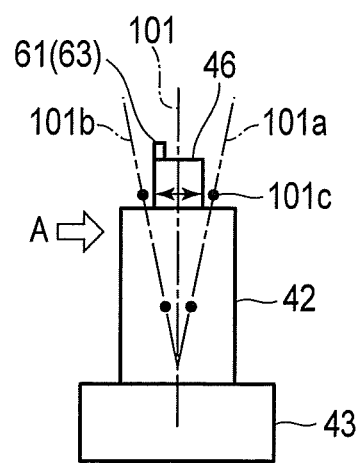 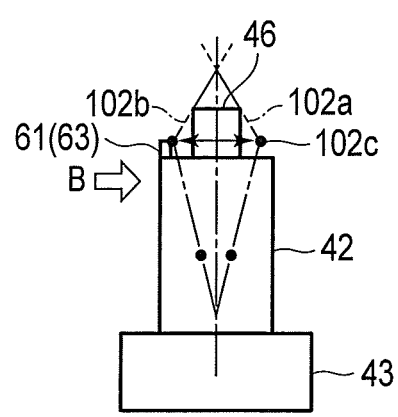 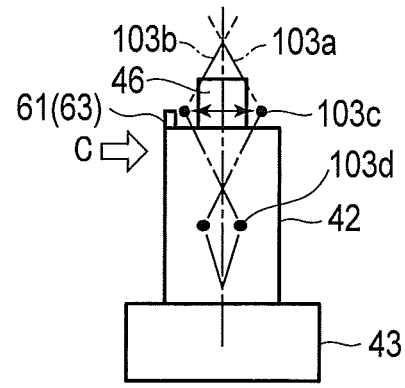
F I G. 12A     F I G. 12B     F I G. 12C

VIBRATION CONTROL SYSTEM AND OPTICAL EQUIPMENT EQUIPPED THEREWITH

CROSS-REFERENCE TO RELATED APPLICATIONS

This application is based upon and claims the benefit of priority from Japanese Patent Application No. 2018-000663, filed Jan. 5, 2018, the entire contents of which are incorporated herein by reference.

FIELD

The present invention relates generally to a vibration control system for controlling oscillation by using actuator units, and an optical equipment equipped with the vibration control system.

BACKGROUND

In general, a variety of vibration-control mechanisms and vibration control systems are used to control vibration and sway (collectively referred to as "vibration") in structures, apparatuses and the like. In particular, it is not preferable to have relative displacements occurring between objects due to vibration.

For example, in an electron beam lithography apparatus which includes an optical column for irradiating an electron beam and a target object subject to drawing by the electron beam, relative displacements between the optical column and the target object caused by vibration are not preferred. Thus, the electron beam lithography apparatus is equipped with a vibration-control mechanism for controlling vibration of the optical column which is excited by accelerations and decelerations of a stage holding the target object occurring when the stage is moved. This is because such relative displacements between the optical column and the target object cause the incident position of the electron beam on the target object to shift.

SUMMARY

An object of the present invention is to provide a vibration control system that has a compact, simple configuration, that adequately control vibration and that is versatile to be commonly used as an attachment in a variety of structures, apparatuses and the like. A further object of the present invention is to provide an optical equipment equipped with such vibration control system.

In one aspect of the present invention, the vibration control system is configured to control vibration of a vibration-controlled object mounted on a base unit. The vibration control system comprising: (i) actuator units each including a piezoelectric element configured to expand and contract, and extending from at least three different circumferential positions on a lateral face of the vibration-controlled object to the base unit to establish connections between the lateral face of the vibration-controlled object and the base unit; (ii) a drive power source configured to supply drive voltages to the piezoelectric elements of the actuator units for causing the piezoelectric elements to expand and contract; (iii) a vibration detector configured to detect a status of vibration of the vibration-controlled object including the amount and direction of the vibration; and (iv) a vibration controller configured to control the vibration of the vibration-controlled object by controlling the voltages supplied by the drive power source to the piezoelectric elements of the actuator units based on the status of vibration detected by the vibration detector, respectively, such that each of the actuator units contracts when the vibration-controlled object moves in a direction away from the actuator unit, and expands when the vibration-controlled object moves in a direction toward the actuator unit.

In another aspect of the present invention, an optical equipment comprises a housing accommodating a movable stage, an optical column arranged on the housing, and a vibration control system configured to control vibration of the optical column due to movements of the movable stage. The vibration control system comprises (i) actuator units each including a piezoelectric element configured to expand and contract, and extending from at least three different circumferential positions on a lateral face of the optical column in at least three directions to the housing to establish connections between the lateral face of the optical column and the housing, (ii) a drive power source configured to supply drive voltages to the piezoelectric elements of the actuator units for causing the piezoelectric elements to expand and contract, (iii) a vibration detector configured to detect a status of vibration of the optical column including the amount and direction of the vibration, and (iv) a vibration controller configured to control the vibration of the optical column by controlling the voltages supplied by the drive power source to the piezoelectric elements of the actuator units based on the status of vibration detected by the vibration detector, respectively, such that each of the actuator units contracts when the optical column moves in a direction away from the actuator unit, and expands when the optical column moves in a direction toward the actuator unit.

BRIEF DESCRIPTION OF THE DRAWINGS

FIG. 5 illustrates an example configuration of arranging piezoelectric members in a piezoelectric element according to a fourth embodiment.

FIG. 6 illustrates an example configuration of arranging piezoelectric members in a piezoelectric element according to a fifth embodiment.

FIG. 7 is an external view of a configuration of an actuator unit according to a first modification when viewed from the top.

FIG. 8 is an external view of a configuration of an actuator unit according to a second modification when viewed from the top.

FIG. 9 schematically illustrates an example arrangement of the actuator units in a modification of the vibration control system.

FIG. 10 is an external view of a configuration of an actuator unit according to a third modification when viewed from the side.

FIG. 12A shows that the state of vibration of an optical column is in a first order vibration mode A.

FIG. 12B shows that the state of vibration of an optical column is in a second order vibration mode B.

FIG. 12C shows that the state of vibration of an optical column is in a third order vibration mode C.

DETAILED DESCRIPTION

The following will describe the vibration control system according to the embodiments of the present invention with reference to the drawings.

Figure 1:
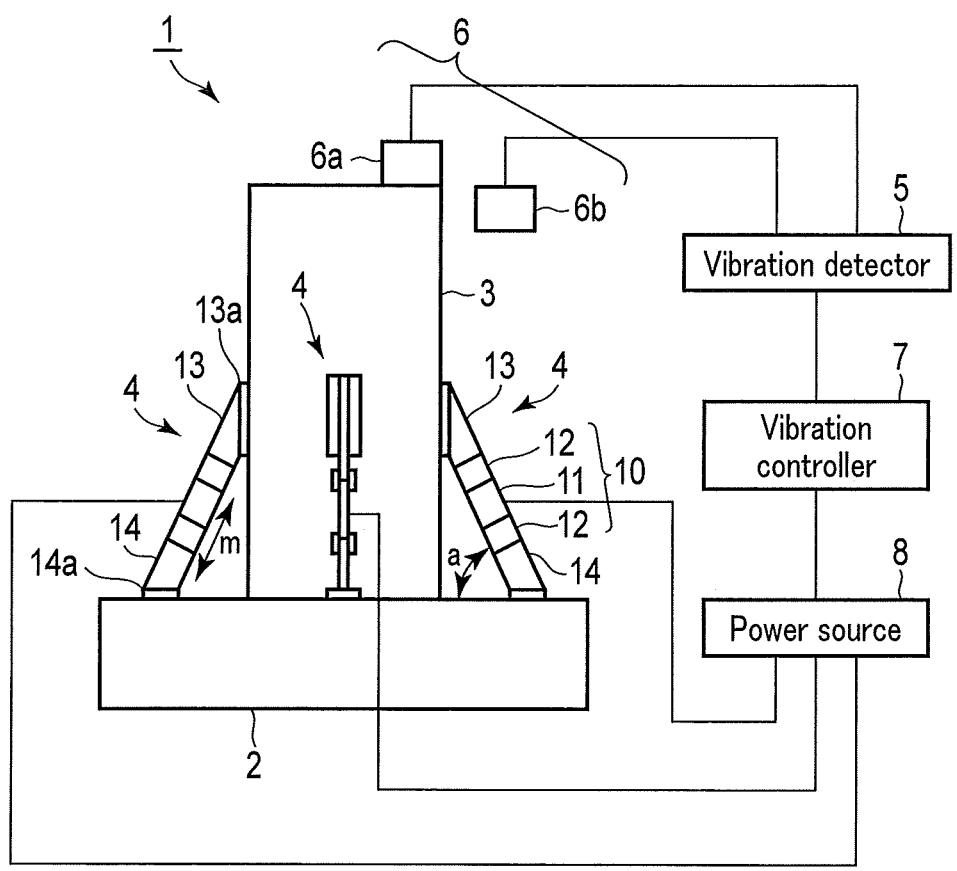
FIG. 1 is a schematic view of a configuration of a vibration control system according to a first embodiment of the present invention.

FIG. 1 schematically illustrates a configuration of a vibration control system 1 according to a first embodiment of the present invention. For example, the vibration control system 1 is applied to a cylindrical or box-shaped vibration-controlled object 3 provided on an upper surface of a base unit 2. The vibration control system 1 for controlling movements of the vibration-controlled object 3 caused by vibration occurring at the vibration-controlled object 3 will be discussed below. The first embodiment described below relates to an example vibration control system equipped in a lithography apparatus configured to draw fine patterns onto a semiconductor wafer or a photomask original plate, wherein a base unit 2 may be a chamber that houses a stage onto which a photomask as a target object is mounted, and wherein the vibration-controlled object 3 may be an optical column that houses a projection system. Vibration of the vibration-controlled object 3 may include vibration propagated from outside and vibration generated by a drive system (not shown) that is located within the vibration-controlled object 3 itself.

The vibration control system 1 comprises, in general: actuator units 4 configured to control vibration to reduce movement of the vibration-controlled object 3; a vibration detector 5 configured to detect vibration in the vibration-controlled object 3; a power source 8 configured to supply voltages for driving the actuator units 4; and a vibration controller 7 configured to control the actuator units 4 in order to reduce vibration of the vibration-controlled object 3, by controlling the power output from the power source 8 according to information regarding the vibration detected by the vibration detector 5.

The vibration detector 5 comprises a vibration detection sensor 6 configured to detect vibration in the vibration-controlled object 3. In the example, the vibration detection sensor 6 includes a first sensor 6a in direct contact with the vibration-controlled object 3, and a second sensor 6b away from the vibration-controlled object 3.

The first sensor 6a is, for example, an acceleration sensor or a distortion sensor. Any sensor with a known configuration may be used as the acceleration sensor. However, a triaxial acceleration sensor employing the MEMS-semiconductor technology is a preferable example. Besides, a piezoresistive triaxial acceleration sensor may be used. Note that if the vibration-controlled object 3 is cylindrical or prismatic a biaxial acceleration sensor may be used instead of the triaxial acceleration sensor by setting the two axes of the triaxial acceleration sensor in the planar directions (XY-directions) of the upper surface of the vibration-controlled object 3. This is because the acceleration vectors in the vertical direction at two positions in the top surface of the vibration-controlled object 3 are cancelled out since rises and descent of the two positions due to vibrations have the same displacement amounts in a vertical direction.

The second sensor 6b may be, for example, an optical sensor for contactless measuring of a distance between the vibration-controlled object 3 and the second sensor 6b with a beam such as a laser beam, and variations in the distance may be detected as vibration width (vibration amplitude). It is preferable to provide the vibration detection sensor 6, as described below, in locations in which the amplitude of vibration of the vibration-controlled object 3 is the largest.

The vibration detector 5 generates vibration information (including vibration width and vibration direction) based on values of movements of the vibration-controlled object 3 detected and output by the vibration detection sensor 6, and outputs the vibration information to the vibration controller 7. When the vibration detection sensor 6 is, for example, a triaxial accelerometer, the vibration detection sensor 6 generates the vibration information from electrical signals representing accelerations in the respective axial directions.

Figure 2A:
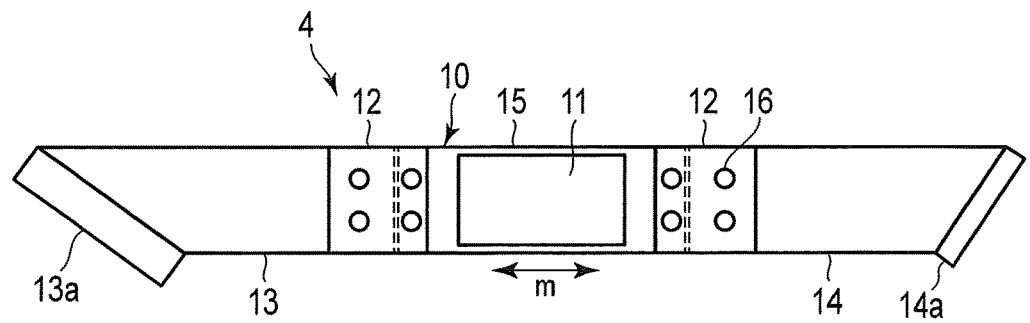
FIG. 2A is an external view of a configuration of an actuator unit according to the first embodiment when viewed from the front.
Figure 2B:
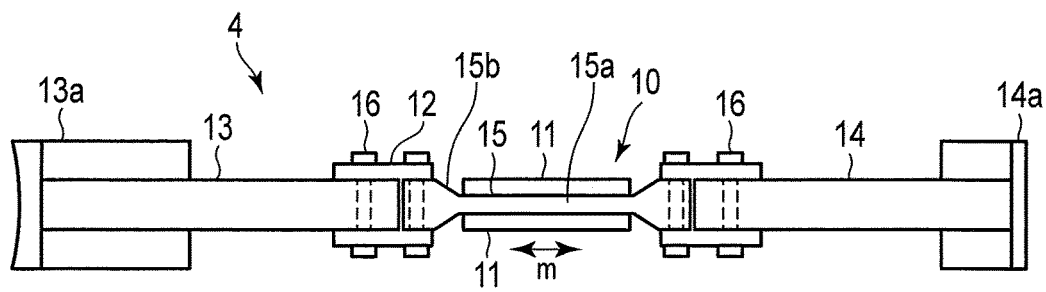
FIG. 2B is an external view of a configuration of the actuator unit according to the first embodiment when viewed from the top.

The following will describe the actuator unit 4 employed in the vibration control system. FIG. 2A is an external view of the actuator unit 4 when viewed from the front, and FIG. 2B is an external view of the actuator unit 4 when viewed from the top. According to the first embodiment, as described below, the actuator units 4 have the shape of elongated plates. The front face and back face with the larger square measures are referred to as "main surfaces" or "main surface sides", and the lateral face on each end in longitudinal direction having the smaller square measures are referred to as "end faces" or "end portions".

Each actuator unit 4 comprises: (i) a rectangular piezoelectric element 10 provided approximately in the center and functioning as a vibration-controlling component; (ii) securing parts 13, 14 secured to each side of the piezoelectric element 10 in longitudinal direction m in which the piezoelectric element 10 expands and contracts; and (iii) supporting members 12 for coupling the piezoelectric elements 10 and the securing parts 13, 14. In this aspect, the configuration that includes the piezoelectric element 10 and the securing parts 13, 14 constitutes the actuator unit 4. Alternatively, in the actuator unit 4, a core member 15 (described below) of the piezoelectric elements 10 and the securing parts 13, 14 may be integrally formed with the same material such as metals or the like. While FIGS. 2A and 2B show the configuration of the actuator unit 4 in which the supporting members couple the piezoelectric element 10 and each of the securing parts 13, 14, it is not necessarily required to use the supporting members 12 when each of the securing parts 13, 14 clamps the core member 15 of the piezoelectric element 10.

The shapes of the securing parts 13, 14 shown in FIGS. 2A and 2B are examples that may be modified as required depending on shapes of the vibration-controlled object 3 to which the securing part 13 or 14 is attached or attaching positions of the vibration-controlled object 3. In the actuator unit 4, the supporting members 12 bridge the ends of the piezoelectric element 10 and the ends of the securing parts 13, 14, respectively, and are mutually secured using bolts 16 inserted through secure holes of the securing parts 13, 14 and fixed by nuts or via caulking. By this way of securing, the actuator unit 4 comprises the piezoelectric element 10 and the securing parts 13, 14 which are connected with each other and arranged in line.

The piezoelectric element 10 comprises an elastically deformable flat core member 15 being the core piece, and a thin film piezoelectric member 11 attached to both main surfaces of the core member 15. The piezoelectric member 11 expands and contracts depending on a drive voltage applied thereto. The piezoelectric member 10 has lines (including a circuit pattern formed on the core member 15) for supplying the drive voltage from the power source 8. The piezoelectric member expands and contracts due to an inverse piezoelectric effect depending on the drive voltage supplied from the power source 8 via the lines to cause the actuator unit 4 to expand and contract. Due to bending or flexing of the core member 15 in the direction intersecting with the plane of the core member 15, or expansion or contraction of the core member 15 along the plane of the core member 15 caused by expansion and contraction of the piezoelectric member 11, the length of the piezoelectric element 10 in longitudinal direction varies. Other embodiments and modifications will be described below, referring to the piezoelectric element 10.

The core member 15 may preferably be a plate-like member of a metallic material, such as a thin steel plate, that has a property of being elastically deformable so that it can be repeatedly deformed by bending and returning to its original shape. Alternatively, a resin member having the property of being elastically deformable to allow deformation by bending may be used. Thus, the material of the core member 15 is not limited to a metal and may be a resin material or any other material being elastically deformable enough to provide the amount of expansion/contraction needed when the actuator unit 4 is attached to the vibration-controlled object 3, and having hardness to some extent.

The core member 15 in the first embodiment has a rectangular external shape, and the directions of expansion and contraction of the core member 15 are along the longitudinal axis of the rectangular (here, corresponding to the directions in which the actuator unit 4 expand and contract). In the example, the core member 15 comprises: a thinned planar portion 15a located in the central portion of the core member of rectangular shape to support the piezoelectric member 11; and end portions 15b having an increased thickness with a taper to couple the core member 15 to the securing parts 13, 14 at the respective end portions 15b of the core member 15. The planar portion 15a is not necessarily thinned with respect to the thickness of the other portions, as long as the area of the core member 15 supporting the piezoelectric member 11 can respond to the displacement of the piezoelectric member 11. In the first embodiment, the end portions 15b have an increased thickness with a taper to couple the piezoelectric element 10 to the securing parts 13, 14 via the supporting members 12. Note that it is not necessary to integrally form the planar portion 15a and the end portion 15b for connecting of the core member 15 with an identical material. The end portions 15b for connecting may be of a material different from that of the planar portion 15a. Also, the end portions 15b for connecting may be separate components from the planar portion 15a, and have a configuration clamping each end of the planar portion 15a. Further, as long as each of the securing parts 13, 14 has a clamping mechanism to hold each end of the piezoelectric element 10, the end portion 15b for connecting may have the same thickness as the planar portion 15a.

Each of the securing parts 13, 14 is coupled to the piezoelectric element 10 at its one end, while at the other end of each securing part 13 or 14, attachments 13a, 14a for securing the actuator unit 4 to the vibration-controlled object 3 and the upper surface of the base unit 2 are provided. The attachments 13a, 14a are arranged so as to slantingly cross the elongating securing parts 13, 14. The slants of the end surfaces of the attachments 13a, 14a, which come into contact with the vibration-controlled object 3 and the upper surface of the base unit 2, define to an angle of inclination of the actuator unit 4 (the angle a in FIG. 1) when securing the actuator unit 4 to the vibration-controlled object 3 and the upper surface of the base unit 2. The attachments 13a, 14a have, for example, screw holes (not shown) to secure the attachments 13a, 14a with bolts or the like to the vibration-controlled object 3 and the base unit 2. If it is necessary to remove the vibration-controlled object 3 from the base unit 2, for example, for maintenance, the actuator unit 4 may have a configuration allowing an easy removal. Therefore, the attachments 13a, 14a may include configurations for engaging with anchorages provided to the vibration-controlled object 3 and the upper surface of the base unit 2, which may be, for example, socket members of C-shaped rails, by plugging the attachments 13a, 14a into the anchorages.

The piezoelectric member 11 may be a membrane-shaped piezoelectric ceramic made of, for example, a piezoelectric material such as zirconate titanate ceramic (PZT) processed into fibrous form and adhered via an epoxy resin. Although not shown in the drawings, the piezoelectric member 11 comprises a polyimide film including electrodes which is bonded via the epoxy resin to the main surfaces of the piezoelectric ceramic.

The piezoelectric member 11 is adhered via an adhesive agent or the like to the planar portion 15a of the core member 15 which is the area for supporting the piezoelectric member 11. The electrodes are electrically connected to the aforementioned lines for supplying drive voltages. The piezoelectric member 11 functions similarly to, for example, a piezoelectric actuator unit called Micro Fiber Composite (MFC).

As can be seen in FIG. 1, the actuator units 4 are slantingly arranged to establish straight-line connections between the lateral face of the vibration-controlled object 3 and the upper surface of the base unit 2. The actuator units 4 are secured to the lateral faces of the vibration-controlled object 3 so that the main surfaces of the actuator units 4 align with imaginary planes crossing the lateral face of the vibration-controlled object 3 when the actuator units 4 establish the slant, straight-line connections between the lateral face of the vibration-controlled object 3 and the upper surface of the base unit 2. In the example, the actuator units 4 are secured so that the main surfaces of the actuator units 4 align with imaginary planes orthogonal to the lateral faces of the vibration-controlled object 3. In other words, in the case where the vibration-controlled object 3 is cylindrical, the main surfaces of the actuator unit 4 are arranged along the radial directions of the vibration-controlled object 3.

In the example, four actuator units 4 extend slantingly downwardly from positions located equidistant intervals (at 90°-intervals) on the periphery of the vibration-controlled object 3 to the upper surface of the base unit 2. The configuration of the first embodiment is unlike a conventional configuration in which one or more support members standing upwardly on the base unit 2 are provided, and the actuator units are provided between the support structures and the vibration-controlled object 3 to secure the vibration-controlled object 3. According to the first embodiment, the integrally formed actuator units 4 couple the vibration-controlled object 3 directly to the base unit 2. Note that although in this embodiment, four actuator unit 4 are used, the number of actuator units 4 is not limited to four. A vibration control for the vibration-controlled object 3 can be realized by arranging at least three actuator units 4 at equidistant intervals (at 120°-intervals) around the vibration-controlled object 3. In the case where the vibration-controlled object 3 is of polygonal columnar the cross-section of which is polygon, for example, pentagon, the actuator units 4 may be provided to three or more of the lateral faces of the vibration-controlled object 3. The actuator unit 4 may also be arranged to each of the lateral faces of the polygonal column.

The vibration controller 7 controls vibration of the vibration-controlled object 3 by controlling the power output from the power source 8 based on the vibration information (including vibration width and vibration direction) output from the vibration detector 5 to cause the piezoelectric elements 10 to expand and contract. In other words, when the vibration-controlled object 3 moves in a direction away from any of the actuator units 4, the vibration controller 7 causes the piezoelectric member 11 of that actuator unit 4 to contract so that the core member 15 of that actuator unit 4 contracts thereby to reduce the entire length of that actuator unit 4. On the other hand, when the vibration-controlled object 3 moves in a direction towards any of the actuator units 4, the vibration controller 7 causes the piezoelectric member 11 of that actuator unit 4 to expand so that the core member 15 of that actuator unit 4 expand thereby to increase the entire length of that actuator unit 4.

The above vibration control system 1 according to the first embodiment has a compact and simple configuration to realize adequate vibration control. The vibration control system 1 has versatility to retrofit a variety of apparatus. There is freedom to the actuator unit 4 of the vibration control system 1 in size and configurations of the piezoelectric elements 10, and in combination with other piezoelectric members and arrangement thereof. For the actuator units 4, the amount of expansion/contraction (expanding/contracting lengths) and the force exerted by the expansion/contraction can be set as desired. By adequately setting the amount of expansion/contraction and force exerted by the expansion/contraction of the piezoelectric members 11 in the piezoelectric elements 10, the adequate performance for controlling a variety of vibration in the vibration-controlled object can be easily achieved. Since the vibration control system 1 has a simple configuration, it has versatility to retrofit a variety of already existing apparatus.

The vibration control system 1 has a simple configuration in which because the actuator units 4 directly couple the vibration-controlled object 3 where the vibration occurs to the base unit 2 mounting the vibration-controlled object 3. Thus, it is not necessary to provide no special structure for the actuator elements 10, such as a column member, a mount, or a stand, to the base unit 2 or in its periphery. Also, since no structure, such as support columns, is required to attach the piezoelectric elements 10 to the equipment, the actuator units 4 does not require much space to be installed. Further, since the freedom in the mounting positions for the actuator units 4 is not limited, the actuator units 4 can be arranged in positions of the vibration-controlled object 3 which are effective against vibration.

Although the vibration control system 1 in the above discussed first embodiment controls vibration in the vibration-controlled object 3 standing on the upper surface of the base unit 2, the present invention is not limited to this. Moreover, since the actuator units 4 in the vibration control system 1 serve to control vibration of the vibration-controlled object 3 but not to effectively secure the vibration-controlled object 3, even if the vibration-controlled object 3 is provided on a surface other than the upper surface of the base unit 2, for example, on the bottom surface, the same effects can be achieved by providing the vibration control system 1 to that vibration-controlled object 3 in a similar fashion.

Figure 3:
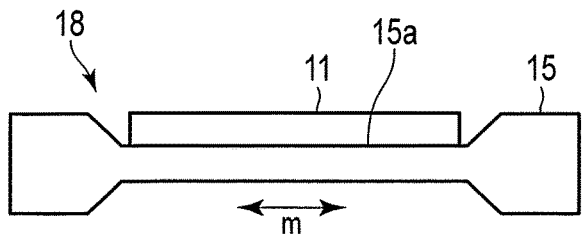
FIG. 3 illustrates an example configuration of a piezoelectric member in a piezoelectric element according to a second embodiment.
Figure 4:
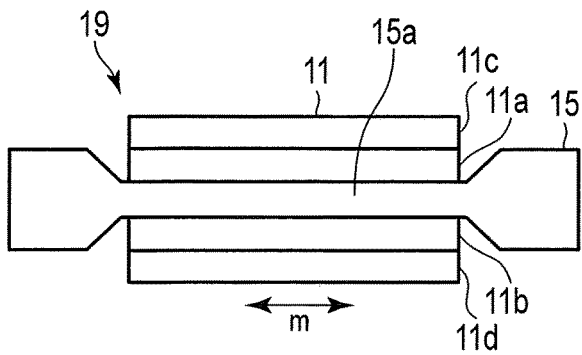
FIG. 4 illustrates an example configuration of stacking piezoelectric members in a piezoelectric element according to a third embodiment.

Next, piezoelectric elements used in actuator units according to other embodiments will be explained with reference to FIGS. 3-6. FIG. 3 illustrates an example configuration of the piezoelectric members 11 in a piezoelectric element 18 according to a second embodiment. FIG. 4 illustrates an example stacked configuration of the piezoelectric members 11 in a piezoelectric element 19 according to a third embodiment. FIG. 5 illustrates an example arrangement of the piezoelectric members 22, 23 in a piezoelectric element 21 according to a fourth embodiment. FIG. 6 illustrates an example arrangement of the piezoelectric members 26, 27 in a piezoelectric element 25 according to a fifth embodiment.

First, the first piezoelectric element 18 according to the second embodiment will be described with reference to FIG. 3.

In the above-discussed piezoelectric element 10, one piezoelectric member 11 is mounted on each of the two main surfaces of the planar portion 15*a* of the core member 15. In contrast, in the piezoelectric element 18 according to the second embodiment, a single piezoelectric member 11 is mounted on one of the two main surfaces of the planar portion 15*a* of the core member 15. While the forces exerted by expansion/contraction of an actuator unit using the piezoelectric element 18 are smaller than those of an actuator unit using the piezoelectric member 10, the actuator unit using the piezoelectric element 18 is preferable for a light-weight vibration-controlled object with low vibration energy.

Next, a second piezoelectric element 19 shall be described with reference to FIG. 4.

In the second piezoelectric element 19, the piezoelectric members 11 (11*a*-11*d*) are stacked on the two main surfaces of the planar portion 15*a*. In the example shown in FIG. 4, the piezoelectric members 11*a*, 11*c* are stacked on one of the main surfaces of the planar portion 15*a*, while the piezoelectric members 11*b*, 11*d* are stacked on the other of the main surfaces. As described above, each of the piezoelectric members 11*a*-11*d* has the polyimide film with the electrodes formed thereon. Note that since the electrodes of each piezoelectric member are connected to separate power supply lines each piezoelectric member 11*a*-11*d* can be driven independently. As such, the piezoelectric members 11*a*-11*d* can be selectively driven for optimal control of vibrations and movements that are unique to various vibration-controlled objects. With such a configuration, a single piezoelectric element 19 can be utilized versatilely for a variety of types of vibration-controlled objects.

The piezoelectric members 11*a*-11*d* may be configured using: (1) piezoelectric members being of the same piezoelectric materials and having the same amounts of expansion/contraction, or (2) piezoelectric members for each main surface being of mutually different piezoelectric materials and having mutually different amounts of expansion/contraction. The piezoelectric members 11*a*-11*d* may further be configured using: (3) piezoelectric members being different in at least one of: piezoelectric materials and amounts of expansion/contraction. The piezoelectric members 11*a*-11*d* may further be any adequate combination of piezoelectric members each having a different characteristic.

In the case (1) where the piezoelectric members 11*a*-11*d* are configured by the stacked piezoelectric members each being of the same piezoelectric materials and having the same amounts of expansion/contraction, the amounts of expansion/contraction of the piezoelectric elements 19 are the same as the piezoelectric element 10, but the forces (expansion force and compression force) exerted at the time of expanding/contracting are substantially twice as much as the forces of the piezoelectric element 10. Thus, the piezoelectric element 19 according to the third embodiment is preferable for controlling vibration of vibration-controlled objects of heavy weight or increased rigidity.

In the case (2) where the piezoelectric members are configured using piezoelectric members being of mutually different piezoelectric materials and having mutually different amounts of expansion/contraction, two examples of the piezoelectric element 19 may be presented. In the first example, each main surface of the core member 15 has a different combination of piezoelectric members of different piezoelectric materials and having different amounts of expansion/contraction. In the second example, each main surface of the core member 15 has a same combination of piezoelectric members of different piezoelectric materials and having different amounts of expansion/contraction. In the first example, the piezoelectric members 11a, 11b are of the same piezoelectric materials and have the same amounts of expansion/contraction, and the piezoelectric members 11c, 11d are of the same piezoelectric materials and have the same amounts of expansion/contraction while the piezoelectric materials and the amounts of expansion/contraction of the piezoelectric members 11c, 11d are different from those of expansion/contraction of the piezoelectric members 11a, 11b. In other words, in the first example, the combination of the piezoelectric members 11a, 11c and the combination of the piezoelectric members 11b, 11d which have the same characteristics are provided on the main surfaces, respectively.

In the second example, the piezoelectric members 11a, 11c provided on one of the main surfaces (ex. the upper surface) are of the same piezoelectric materials and have the same amounts of expansion/contraction, and the piezoelectric members 11b, 11d provided on the other of the main surfaces (ex. the bottom surface) are of the same piezoelectric materials and have same amounts of expansion/contraction while the materials and the amounts of expansion/contraction of piezoelectric members 11b, 11d are different from those of the piezoelectric members 11a, 11c. In other words, in the second example, a combination of the piezoelectric members 11a, 11c provided on one of the main surfaces are different in characteristics from a combination of the piezoelectric members 11b, 11d provided on the other of the main surfaces. Each of the piezoelectric members 11a-11d is separately connected to each of the power supply lines and can be selectively driven. As such, the piezoelectric members 11a-11d can be selectively driven for optimal control of vibrations and movements that are unique to various vibration-controlled objects. With such piezoelectric members of mutually different piezoelectric materials and having mutually different amounts of expansion/contraction, and by selectively driving the piezoelectric members 11a-11d, the range of the amount of expansion/contraction of the actuator unit 4 can be selected so that a variety of vibration can be effectively controlled.

Here, the case (3) will be discussed in which the piezoelectric members 11a-11d are configured using piezoelectric members having different characteristics in at least one of: the piezoelectric materials and the amounts of expansion/contraction. For example, the piezoelectric materials of the piezoelectric members 11c, 11d are the same as those of the piezoelectric members 11a, 11b, but the amounts of expansion/contraction of the piezoelectric members 11c, 11d are different from those of the piezoelectric members 11a-11b.

Note that in the example configurations of the piezoelectric elements 19 in the above-described case (1)-(3), the same number of piezoelectric members 11a-11d are stacked in both main surfaces of the planar portions 15a of the core members 15. However, the numbers of stacked piezoelectric members may be different for each of the main surfaces. In detail, two piezoelectric members may be provided on one of the two main surfaces, while a single piezoelectric member may be provided on the other of the main surfaced. In this manner, it is possible to selectively use any appropriate combination in different arrangements (serially arranged in line or stacked) and in different numbers of piezoelectric members (in a single-layer or in multiple layers) for the one main surface and the other main surface of the second piezoelectric elements 19 in the above-described cases (1)-(3). Also, a plurality of piezoelectric members used in the piezoelectric element 19 may be separately driven by the controller 56. Alternatively, the plurality of piezoelectric members may be put into groups, and each group may be separately driven by the controller 56.

In order to realize a vibration control by the actuator units 4 that is appropriate to the vibration characteristics of a vibration-controlled object 3, the piezoelectric element 19 can have appropriate amounts of expansion/contraction and appropriate forces exerted by expansion/contraction, by setting the configuration and arrangement of the piezoelectric members in the piezoelectric element 19 (ex. in a single layer or in multiple stacked layers, and at positions of the piezoelectric members on the main surfaces of the core members 15) according to the amplitude (width) and frequency of vibration occurring at that vibration-controlled object 3 which are detected in advance or assumed.

Next, a piezoelectric element 21 according to a fourth embodiment will be described with reference to FIG. 5.

In this piezoelectric element, a plurality of piezoelectric members 22, 23 are serially arranged along the direction of expansion/contraction (m) on the main surface of the core member 24a. In detail, as can be seen in FIG. 5, the piezoelectric element 21 includes two piezoelectric members 22, 23 which are serially arranged on the main surface of the planar portion 24a of the core member 24 along the longitudinal direction of the core member 24 (the expansion/contraction direction m). The piezoelectric members 22, 23 are similar to the above-described piezoelectric member 11 (shown in FIG. 2A).

Each of the piezoelectric members 22, 23 has separate electrodes for receiving a driving voltage, and the above-described vibration controller 7 individually controls the piezoelectric members 22, 23 to expand/contract by supplying the driving voltages separately to the piezoelectric members 22, 23. However, depending on a functional specification of an apparatus, the piezoelectric members 22, 23 may be commonly controlled by the vibration controller 7 for simultaneous expansion/contraction. The piezoelectric members 22, 23 may vary similarly in expansion/contraction, or have similar amounts of expansion/contraction. Alternatively, hey may vary differently in expansion/contraction, or have different amounts of expansion/contraction. The piezoelectric materials of the piezoelectric members 22, 23 may be the same material or different materials. Of course, the number of piezoelectric members is not limited to two, and may be appropriately set as needed.

In the fourth embodiment, serially arranging the piezoelectric members 22, 23 along the expansion/contraction direction m of the piezoelectric element 21 increases the amount of expansion/contraction of the piezoelectric element 21, and thereby, the length of expansion/contraction of the actuator unit 4 can be increased. This configuration is thus preferable in cases in which the vibration of the vibration-controlled object 3 has relatively large amplitude. Driving one of the piezoelectric members 22, 23 to expand and contract, the amount of expansion/contraction of the piezoelectric element 21 can be reduced to achieve the same effects as the above-described piezoelectric member 11 achieves.

On the other hand, configurations may also be considered in which the above-described piezoelectric member 11 is divided into two half-sized piezoelectric members 22, 23 which are serially arranged along the longitudinal direction of the piezoelectric element 21 (the expansion/contraction direction m) on the main surface of the planar portion 24a. If one of those piezoelectric members 22, 23 is driven to expand and contract, the amount of expansion/contraction of the piezoelectric element 21 becomes less than the amount of expansion/contraction of the above-described piezoelectric element 10 (shown in FIG. 2A). In this case, since the amounts of expansion/contraction of the actuator unit is smaller due to the shorter length of expansion/contraction of the core member 24 of the piezoelectric element 21, it is preferable for controlling vibration of a large vibration number (a high frequency).

Thus, by using combinations of a plurality of same-sized or different-sized piezoelectric members in the piezoelectric element 21, the range between the maximum value and the minimum value in the amount of expansion/contraction of the piezoelectric element 21 can be varied within the variable range of the supplied drive voltage. Using preferable piezoelectric members selected from the piezoelectric members of different sizes and of different piezoelectric materials improves the response of the actuator units 4 to the movement of the vibration-controlled object 3 and realizes effective control of vibration that has a large number of vibrations over time (a high frequency).

As described above, in the fourth embodiment, the piezoelectric element 21 can handle a broad range of vibration of the vibration-controlled object 3, from a large-amplitude to a small-amplitude of vibration as well as from a high frequency to a low frequency of vibration.

Next, a piezoelectric element 25 according to a fifth embodiment of the present invention will be described with reference to FIG. 6.

In this piezoelectric element 25, a plurality of piezoelectric members 26, 27 extending along the direction m of expansion/contraction of the piezoelectric element 25 are arranged in parallel on the main surface of the core member 28. As can be seen in FIG. 6, the piezoelectric element 25 comprises two types of piezoelectric members 26, 27 extending in the longitudinal direction of the piezoelectric element 21 (the expansion/contraction direction m) and arranged in parallel on the main surfaces of the planar portion 28a of the core member 28.

Similar to the above-discussed piezoelectric element 21, each of the piezoelectric members 26, 27 may be individually controlled by the vibration controller 7 to expand and contract, or commonly controlled by the vibration controller 7 to simultaneously expand and contract. The piezoelectric members 26, 27 may similarly or differently vary in expansion/contraction, or may have the same or different amounts of expansion/contraction. The piezoelectric members 26, 27 may further be of the same or different piezoelectric materials. Of course, the numbers of respective piezoelectric members 26, 27 are not limited to two and may be set as needed.

The forces exerted by expansion/contraction of the piezoelectric element 25 can be switched by driving one or both of the piezoelectric members 26, 27. Therefore, when a control of vibration of relatively large amplitude requires stronger vibration control forces (energy), the forces generated by the piezoelectric element 25 can be increased. The actuator unit 4 using the piezoelectric element 25 can handle a broad range of vibration from large amplitude to a small amplitude.

When using piezoelectric members 26, 27 of different variations in expansion/contraction or having different amounts of expansion/contraction, co-existing vibrations of large and small amplitudes can be effectively controlled sooner by selecting the piezoelectric members from piezoelectric members 26, 27 which are preferable for these amplitudes.

Next, a first modification of the actuator unit shall be described with reference to FIG. 7.

FIG. 7 is an external view of an actuator unit 31 according to a first modification when viewed from the top.

In the actuator unit 31 in the first modification, two piezoelectric elements 10a and 10b are stacked and arranged in parallel. The stacked piezoelectric elements 10a, 10b couple with the securing parts 13, 14. Both piezoelectric elements 10a, 10b have a configuration similar to the above-described piezoelectric element 10.

In the actuator unit 31, the end portions 15b of the piezoelectric elements 10a, 10b are mounted on the main surfaces of the end portions of the securing parts 13, 14, and secured by anchorages 16 that are inserted into aligned holes of the piezoelectric elements 10a, 10b and the securing parts 13, 14. The configuration of actuator unit 31 is similar to the configuration of the actuator unit 4 shown in FIG. 2B, except that two piezoelectric elements 10 are provided in the actuator unit 4.

Since the actuator unit 31 in the first modification contains the two stacked piezoelectric elements 10a, 10b, the force exerted by expansion/contraction of the piezoelectric elements 10a, 10b when the piezoelectric elements 10a, 10b are driven simultaneously is twice as much as the force exerted by expansion/contraction of the single actuator unit 4. Of course, it is not necessary that the piezoelectric elements 10a, 10b are always simultaneously driven. The vibration controller 7 may control the piezoelectric elements 10a and 10b to selectively drive one of the piezoelectric elements 10a and 10b. If vibration of the vibration-controlled object 3 causes distortion of the actuator unit 31 about its longitudinal axis thereof, the actuator unit 31 is more resistant to the distortion than the actuator unit 4. Thus, in the actuator unit 31, the expansions/contractions of the piezoelectric members 11 of the piezoelectric elements 10a, 10b more effectively contribute to the vibration control. Further, even if deformation of the vibration-controlled object 3 due to aging, heat and the like generates forces to distort the actuator unit 31 attached to the vibration-controlled object 3, the configuration of the actuator unit 31 can prevent the force from distorting the piezoelectric elements 10a, 10b.

Next, a second modification of the actuator unit will be described with reference to FIG. 8.

FIG. 8 is an external view of an actuator unit 32 according to the second modification when viewed from the top.

In the second modification, the actuator unit 32 comprises two piezoelectric elements 10a, 10b serially arranged in a direction of expansion/contraction of the actuator unit 4. The securing parts 13, 14 are coupled to the outer ends of the piezoelectric elements 10a, 10b, respectively, and arranged in line with the piezoelectric elements 10a, 10b. Each of the piezoelectric elements 10a, 10b has a configuration similar to the above-described piezoelectric elements 10.

In the actuator unit 32, one end of the piezoelectric element 10a and one end of the piezoelectric element 10b are coupled together via a supporting member 35. The other end of the piezoelectric element 10a and the other end of the piezoelectric element 10b are coupled to the securing member 33, 34 via the supporting members 35, respectively. The supporting members 35 secure the piezoelectric elements 10a, 10b and the securing parts 13, 14 via anchorages 16, such as bolts/nuts, and rivets.

In the actuator unit 32 according to the second modification, the serially arranged piezoelectric elements 10a, 10b can increase the amounts of expansion/contraction of the actuator unit 32. Thus, the actuator unit 32 can control a broad range of vibration of the vibration-controlled object, from a large amplitude to small amplitude and from a high frequency to a low frequency. Note that other coupling mechanisms may be provided between the piezoelectric element 10a and the piezoelectric element 10b.

Next, a modification of the vibration control system according to another embodiment of the present invention will be described with reference to FIG. 9. FIG. 9 schematically illustrates an arrangement of the actuator units 36 in the modification of the vibration control system.

As shown in FIG. 1, while the actuator units 4 of the above-described vibration control system are secured to the vibration-controlled object 3 and the base unit 2 so that the actuator units 4 make linear and diagonal connections between the lateral faces of the vibration-controlled object 3 and the upper surface of the base unit 2, the main surfaces (as mentioned above, corresponding to front and back surfaces of an elongated plate having the large square measures) of the actuator unit 4 align with the directions orthogonal to or intersecting the lateral face of the vibration-controlled object 3.

In contrast, in this modification, the actuator units 36 are secured to the base unit 2 and the vibration-controlled object 3 so that the main surfaces of the actuator units 36 as well as the main surfaces of the piezoelectric elements 10 align with the circumferential direction of the vibration-controlled object 3. As shown in FIG. 9, in a case where the vibration-controlled object 3 is cylindrical, the actuator units 36 are secured to the base unit 2 and the vibration-controlled object 3 so that the main surfaces of the actuator units 36 align with the directions orthogonal to the radial directions of the vibration-controlled object 3, or in other words, align with the directions tangent to the lateral face of the vibration-controlled object 3.

Next, an actuator unit according to a third modification will be explained with reference to FIG. 10.

FIG. 10 is an external view of the actuator unit 37 according to the third modification when viewed from the side. In the above-described actuator unit 4 shown in FIGS. 2A and 2B, the piezoelectric element 10 and securing parts 13, 14 are arranged in line. In contrast, the actuator unit 37 of the third modification has a curved lateral shape like a fan.

In the actuator unit 37, for example, rectangular piezoelectric elements 38 shaped like paper strips, and fan-like securing parts 39 are alternately arranged and secured to each other via the anchorages 16 such as bolts/nuts. In the example, the actuator unit 37 can have an adequately curved lateral shape by adjusting the fan-out angles of the securing parts 39 and setting the number of securing parts 39 to be used. The piezoelectric elements 38 expand or contract in the directions identified by "m" in FIG. 10.

As illustrated in FIG. 1, since there are spaces near an area where the base unit 2 and the vibration-controlled object 3 are connected, the line-shaped actuator units 4 can be provided in the area. However, if other units are provided near the area, there may be a case where the other units may be obstacles to installation of the line-shaped actuator units 4. Or, a longer actuator unit 4 may be required to circumvent those other units. The actuator unit 37 provides a solution to this issue.

As for the third modification, FIG. 10 shows an example of the actuator unit 37 having a curved, fan-like lateral shape. However, the lateral shape of the actuator unit 37 is not limited to this. The actuator unit 37 may also have a lateral shape in which the curved portion is combined with the line-shaped portion as shown in FIG. 8.

Since the actuator unit 37 of the third modification has a desirably curved lateral shape, the actuator unit 37 can be provided between the base unit 2 and the vibration-controlled object 3 to circumvent other obstructive units.

Figure 11:
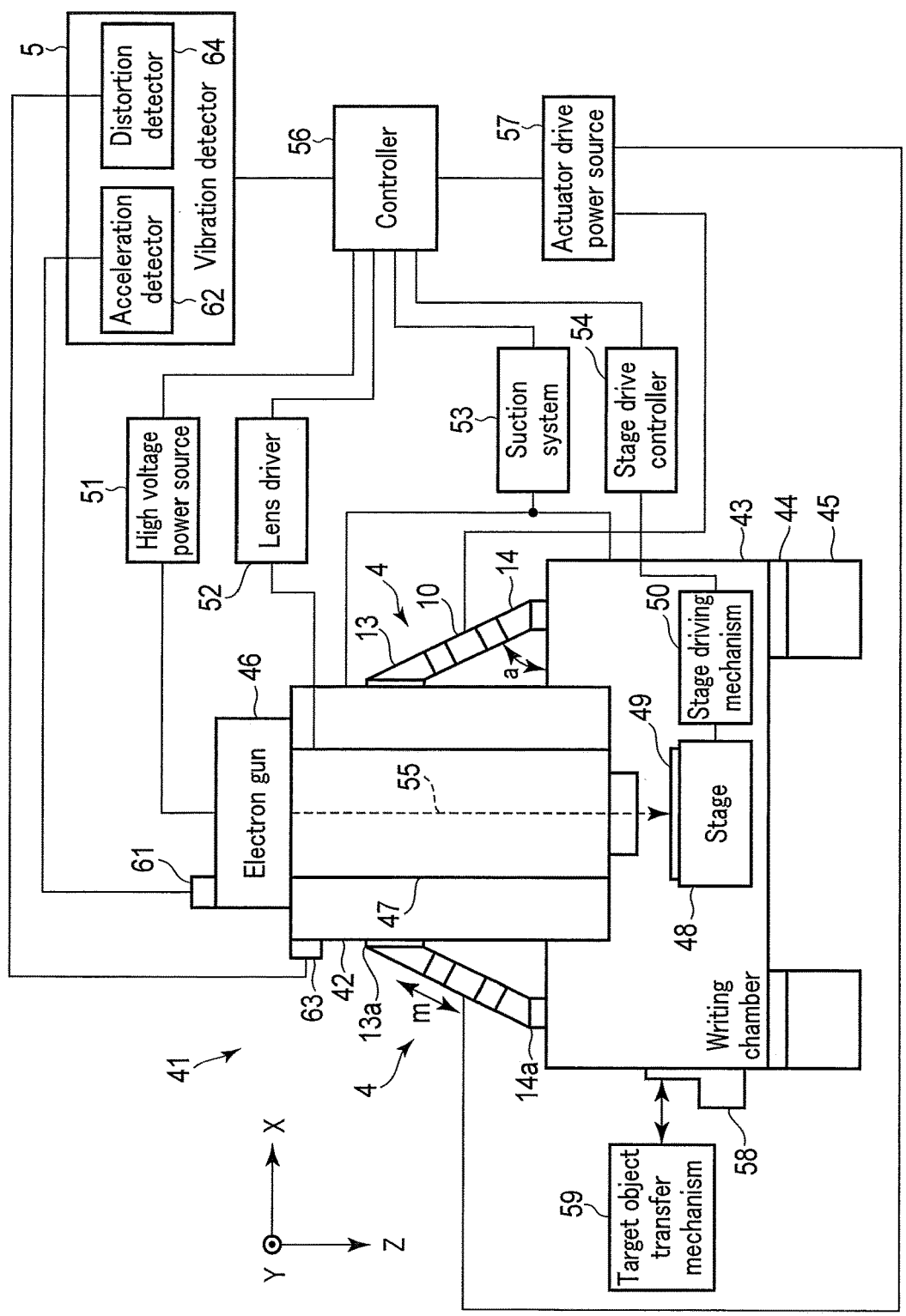
FIG. 11 schematically illustrates an example configuration of an electron beam lithography apparatus to which the vibration control system according to the first embodiment is applied.

Next, an optical equipment to which the vibration control system 1 according to the first embodiment is applied will be described with reference to FIG. 11. FIG. 11 schematically illustrates an example configuration of an electron beam lithography apparatus for the optical equipment to which the vibration control system 1 according to the first embodiment is applied. This electron beam lithography apparatus is configured to draw fine patterns onto semiconductor wafers or photomask original plates. In this example, the electron beam lithography apparatus is presented by way of example for the optical equipment. However, vibration control systems as disclosed herein may be applied to any apparatus in which a vibration-controlled object, such as an optical column, is provided on a housing, such as a writing chamber for a target object. The beam is not limited to an electron beam, and may be any electromagnetic wave such as a laser beam or X-ray. Thus, the term "optical" used herein may be interpreted not only as "light", but also as any "electron beam" and "electromagnetic wave". Note that in the electron beam lithography apparatus 41 shown in FIG. 11 which uses the vibration control system according to the first embodiment, each equivalent component is represented by a like reference numeral in the above-described embodiments and in FIG. 11, and will not be described in further detail.

The electron beam lithography apparatus 41 comprises a housing 43 and an optical column 42 in its main body. The housing 43 accommodates a movable stage 48 configured to hold a target object 49. The optical column 42 is provided on the housing 43 and includes an electron gun 46 provided as a light source that irradiates an electron beam 55 onto the target object 49 on the stage 48. Support legs 45 are provided to the bottom part of the housing 43. Vibration isolating members 44 are provided between the housing 43 and the support legs 45. The support legs 45 are mounted on the floor surface of a clean room or the like. By providing the vibration isolating members 44 between the housing 43 and the support legs 45, vibration of the floor surface can be prevented from propagating to the apparatus main body. A rigid surface plate may be provided between the bottom part of the housing 43 and the vibration isolating members 44. Note that the target object 49 may be, for example, a glass substrate for a photo mask.

The housing 43 may be, for example, a hollow metal box made from a stainless alloy or the like, and configured to retain vacuum. The housing 43 has an aperture for introducing and removing the target object 49 (not shown), and a gate 58 that can be opened and closed and that covers the aperture in an airtight manner. After opening the gate 58, the target object 49 is introduced from outside by a target object transfer mechanism 59, and placed onto the stage 48. Similarly, after drawing patterns on the target object 49, the target object 49 is removed from the stage 48 and transferred to the outside by the target object transfer mechanism 59.

A stage driving mechanism 50 is provided in the stage interior or near the stage 48 to move the stage 48 when certain patterns are drawn on the target object 49. While the patterns are being drawn, the stage 48 is moved in horizontal directions, so that the target object 49 mounted on the stage is displaced 2-dimensionally (ex. in the XY-directions). Instead of finely displacing the target object 49 to draw patterns, the electron beam may be bent or scanned using a lens driver 52 (discussed below). The stage 48 may be moved to coarsely displace the target object 49. The stage driving mechanism 50 may move the stage 48 up and down (in the Z-direction: in the gravity direction) to adjust the height of the target object 49. The force reacting to the inertial force due to acceleration/deceleration in the movement of the stage 48 may be transmitted as vibration to the housing 43. The faster the movement of the stage 48, the greater the influence.

The electron beam lithography apparatus 41 comprises a high voltage power source 51 configured to supply high voltage for emitting the electron beam from the electron gun 46, a lens driver 52 configured to drive the optical system 47, a suction system 53 configured to suck air from the inside of the housing 43 and the inside of the optical column 42 until these insides are in a vacuum state, a stage drive controller 54 configured to drive the stage driving mechanism 50, an actuator drive power source 57 configured to drive the above actuator unit 4, an vibration detector 5 configured to obtain vibration information (discussed below) from an acceleration sensor 61 and a distortion sensor 63, and a controller 56 configured to control each component of the entire system. The electron beam lithography apparatus 41 further comprises an acceleration sensor 61 provided on the upper surface of the optical column 42 or on the upper surface of the electron gun 46, and a distortion sensor 63 provided to the lateral surface of the optical column 42.

The suction system 53 may be a combination of, for example, a dry pump used for coarse sucking and an ion pump or turbo-molecular pump used for ultrahigh-vacuum sucking. Vacuum valves (not shown) for switchable sucking action are provided on pipes connecting each of the pumps with the housing 43 and the optical column 42. Leak valves are provided to each of the housing 43 and optical column 42 to return the interiors of the housing 43 and optical column 42 to atmospheric pressure. The housing 43 in this example has a single chamber. However, an additional buffer chamber for an extra evacuation chamber may be added to shorten time for the suction process.

Although it is not discussed in detail, an optical system 47 including an illumination lens, an aperture, a projection lens, a polarizer, an object lens etc. is provided in the optical column 42. The optical system 47 is driven by the lens driver 52, and adjust, deflect and scan the electron beam 55 emitted from the electron gun 46 to draw desirable patterns onto the target object 49 by irradiating the target object 49 with the electron beam 55 while the stage 48 is moved. It is important that the electron beam 55 be accurately irradiated onto the target position of the target object 49. It is necessary to accurately irradiate a desired position or area of the target object 49. The finer the patterns to be drawn become, the more critical the reducing relative displacements between the optical system 47 of the optical column 42 and the targeted position of the target object 49 becomes.

The vibration control system in the electron beam lithography apparatus 41 comprises the actuator units 4, the vibration detector 5, the acceleration sensor 61, the distortion sensor 63, and the controller 56 as described above.

As shown in FIG. 2A, in each actuator unit 4, the rectangular piezoelectric element 10, and the securing parts 13, 14 respectively secured to the ends of the piezoelectric element 10 in the expansion/contraction direction m via the supporting members 12 are arranged in line. As shown in FIG. 11, the actuator units 4 extend slantingly and downwardly from the lateral faces of the optical column 42 in four equidistant radial directions, and reach to the upper surface of the housing 43. The attachments 13a, 14a provided to the distal ends of the securing parts 13, 14 are secured to the optical column 42 and the housing 43 via screw clumping or the like so that the slant angle a of each actuator unit 4 is maintained.

In this example, the acceleration sensor 61 is provided to the upper surface of the electron gun 46 that is provided on the optical column 42. The distortion sensor 63 is provided in the upper lateral surface part of the optical column 42. As mentioned below, both sensors 61, 63 may be provided in locations with large vibration amplitude.

The acceleration sensor 61 detects the magnitude (the vibration width) and the direction (the vibration direction) of displacements of the optical column 42 caused by the vibration due to the movements of the stage 48 driven by the stage driving mechanism 50. The distortion sensor 63 detects the magnitude of vibration from deformation of the optical column 42 caused by the vibration. In particular, the acceleration sensor 61 detects vibration occurring when the stage 48 transitions from a rest state to a moving state, and from a moving state to a rest state. The acceleration sensor 61 also detects vibration occurring when there are changes in the speed of the stage 48. Detection signals output by the acceleration sensor 61 are sent to the acceleration detector 62 in the vibration detector 5. The acceleration detector 62 generates vibration information representing at least the vibration width and the vibration direction based on the received detection signals.

The distortion detector 64 generates vibration information representing the magnitude of vibration based on the distortion-detection signals received from the distortion sensor 63. The vibration detector 5 complementarily applies the vibration information generated by the distortion detector 64 to the vibration information generated by the acceleration detector 62 to generate vibration information and output it to the controller 56. Note that in this example, the vibration information is obtained using a combination of the vibration information from the acceleration detector 62 and the vibration information from the distortion detector 64. However, the vibration information may be obtained from one of: the vibration information from the acceleration detector 62 and the vibration information from the distortion detector 64. As mentioned above, for contactless distance measurement using a beam such as a laser beam or the like, an optical sensor may be used.

The controller 56 controls expansion/contraction of each of the actuator units 4 to reduce the vibration of the optical column 42 by controlling the voltage outputs of the actuator drive power source 57 based on the vibration information representing at least the vibration width and the vibration direction. In other words, each actuator unit 4 is controlled by the controller 56 so that when the optical column 42 moves in a direction away from that actuator unit 4 due to the vibration, the same actuator unit 4 contracts, and when the optical column 42 moves in a direction toward that actuator unit 4 due to the vibration, the same actuator unit 4 expands.

Next, positions in which to mount the actuator units 4 for minimizing vibration of the optical column 42 will be described with reference to FIGS. 12A, 12B and 12C.

FIG. 12A is a view showing that the state of vibration of the optical column 42 is in a first order vibration mode A.

As described above, the optical column 42 of the electron beam lithography apparatus 41 accommodates the optical system 47 including a plurality of components such as an illumination lens, an aperture, a projection lens, a polarizer, and an object lens. Since the components have different weights, the structure of the optical column 42 has, during vibration, a plurality of point masses (ex. representative point masses 101c). Depending on the state of vibration of the optical column 42 (ex. the vibration width), the presence of the point masses 101c creates vibration in the first order vibration mode A, in which the point masses 101s synchronously vibrate between the approximately linear lines 101a-101b. As shown in FIG. 12A, in the first order vibration mode A, the optical column 42 standing on the housing 43 vibrates about a pivot point on its base. Thus, by providing the acceleration sensor 61 (or the distortion sensor 63) on the upper surface (the top) of the electron gun 46 positioned on the optical column 42 as shown in FIG. 11, the acceleration sensor 61 (or the distortion sensor 63) can detect vibration of the optical column 42 with a greatest vibration width (a greatest amplitude of vibration). By detecting the vibration of the optical column 42 with the greatest vibration width, reduction of vibration by controlling the vibration can be accurately determined.

FIG. 12B is a view showing that the state of vibration of the optical column 42 is in a second order vibration mode B.

In the second order vibration mode B, the plurality of point masses of the optical column 42 vibrate between the lines 102a-102b which bend at one point mass 102c of the plurality of mass points and make a single intersection.

As shown in FIG. 12B, in the second order vibration mode B, the optical column 42 standing on the housing 43 vibrates about two pivot points one of which is positioned on the base of the optical column 42 and the other of which is positioned above the optical column 42. Thus, by providing the acceleration sensor 61 (or the distortion sensor 63) on the top of the optical column 42, the acceleration sensor 61 (or the distortion sensor 63) can detect vibration of the optical column 42 with a greatest vibration. By detecting the vibration with the greatest vibration width, reduction of vibration by controlling the vibration can be accurately determined.

FIG. 12C is a view showing that the state of vibration of the optical column 42 is in a third order vibration mode C.

In the third order vibration mode C, the plurality of point masses vibrates between lines 103a-103b bend at each of two point masses 103c, 103d of the plurality of point masses.

As shown in FIG. 12C, in the third order vibration mode C, the optical column 42 standing on the housing 43 vibrates about three pivot points: one of which is positioned on the base of the optical column 42, another one of which is positioned in the middle of the optical column 42, and the other one of which is positioned above the optical column 42. Therefore, by providing the acceleration sensor 61 (or the distortion sensor 63) at the point mass 103c which is positioned above the optical column 42 and has the largest vibration width, the acceleration sensor 61 (or the distortion sensor 63) detect vibration of the optical column with a largest vibration width. By detecting the vibration with the greatest vibration width, reduction of vibration by controlling the vibration can be accurately determined.

As described above, the vibration control systems according to the various embodiments included in the electron beam lithography apparatus 41 have a simple configuration in which the linearly extending actuator units are arranged between the optical column 42 and the housing 43. Since those vibration control systems are made more compact and light-weight than conventionally-configured vibration systems, no rigid supporting structure for the actuator units are required, so that making the electron beam lithography apparatus 41 large-scale and increasing the weight can be prevented. Since no additional support structure for the actuator unit such as columns and walls are needed when mounting, a smaller space for installing the actuator units is required in the apparatus. Further, since the degree of freedom in the mounting positions of the actuator units is high, the actuator units can be provided in locations of the apparatus which are more effective against vibration.

While the electron beam lithography apparatus 41 has a vibration-control mechanism or a vibration-isolating mechanism that is configured to prevent propagation of vibration from the floor, the increase in weight of the electron beam lithography apparatus 41 due to equipping the vibration control systems is less. Thus, the electron beam lithography apparatus 41 equipped with the vibration control systems according to the present embodiments does not require a big installation space. Since the weight of the electron beam lithography apparatus 41 has a small increase by the vibration control systems according to the present embodiments, further floor reinforcement in the site of installation of the electron beam lithography apparatus 41 for resisting the weight of the apparatus 41 is not needed.

The present invention is not limited to the modifications described above, and various modifications may be implemented without departing from the concept or scope of the present invention.

In the modifications described above, descriptions for portions which are not directly necessary to explain the present invention, such as detailed configurations of apparatus and control methods, are omitted. However, it should be noted that the configurations of the apparatus and the control methods can be suitably selected and used if required. All inspection methods and inspection apparatuses that comprise the elements of the present invention and that can be suitably modified by a person ordinarily skilled in the art are encompassed in the scope of the present invention.

What is claimed is:

1. A vibration control system configured to control vibration of a vibration-controlled object mounted on a base unit, the vibration control system comprising:
    actuator units each including a piezoelectric element configured to expand and contract, and extending from at least three different circumferential positions on a lateral face of the vibration-controlled object in at least three different directions to the base unit to establish connections between the lateral face of the vibration-controlled object and the base unit;
    a drive power source configured to supply drive voltages to the piezoelectric elements of the actuator units for causing the piezoelectric elements to expand and contract;

a vibration detector configured to detect a status of vibration of the vibration-controlled object, the status of vibration including the amount and direction of the vibration; and a vibration controller configured to control the vibration of the vibration-controlled object by controlling the voltages supplied by the drive power source to the piezoelectric elements of the actuator units based on the status of vibration detected by the vibration detector, respectively, such that each of the actuator units contracts when the vibration-controlled object moves in a direction away from the actuator unit, and expands when the vibration-controlled object moves in a direction toward the actuator unit.

2. The vibration control system according to claim 1, wherein each of the actuator units further comprises:
a deformable flat core member; and
a piezoelectric member mounted on the deformable flat core member to form the piezoelectric element.

3. The vibration control system according to claim 2, each of the actuator units further comprises securing parts arranged in line with the piezoelectric element and configured to secure the piezoelectric element to the lateral faces of the vibration-controlled object and to the base unit.

4. The vibration control system according to claim 1, wherein the actuator units, when arranged between the lateral faces of the vibration-controlled object and the base unit, slantingly extend from the lateral face of the vibration-controlled object to the base unit.

5. The vibration control system according to claim 1, wherein each of the actuator units comprises the piezoelectric element including a plurality of the piezoelectric members arranged in parallel or in serial.

6. The vibration control system according to claim 1, wherein each of the actuator units comprises a plurality of piezoelectric elements arranged in parallel or in serial.

7. The vibration control system according to claim 1, wherein the vibration detector is located at a position where the vibration of the vibration-controlled object has largest amplitude.

8. An optical equipment comprising:
a housing accommodating a movable stage;
an optical column arranged on the housing; and
a vibration control system configured to control vibration of the optical column caused by movements of the movable stage,
wherein the vibration control system comprises:
actuator units each including a piezoelectric element configured to expand and contract, and extending from at least three different circumferential positions on a lateral face of the optical column in at least three directions to the housing to establish connections between the lateral face of the optical column and the housing;

a drive power source configured to supply drive voltages to the piezoelectric elements of the actuator units for causing the piezoelectric elements to expand and contract;

a vibration detector configured to detect a status of vibration of the optical column, the status of vibration including the amount and direction of the vibration; and a vibration controller configured to control the vibration of the optical column by controlling the voltages supplied by the drive power source to the piezoelectric elements of the actuator units based on the status of vibration detected by the vibration detector, respectively, such that each of the actuator units contracts when the optical column moves in a direction away from the actuator unit, and expands when the optical column moves in a direction toward the actuator unit.

9. The vibration control system according to claim 8, wherein each of the actuator units further comprises:
a deformable flat core member; and
a piezoelectric member mounted on the deformable flat core member to form the piezoelectric element.

10. The vibration control system according to claim 9, each of the actuator units further comprises securing parts arranged in line with the piezoelectric element and configured to secure the piezoelectric element to the lateral faces of the vibration-controlled object and to the base unit.

11. The optical equipment according to claim 8, wherein the vibration detector includes an acceleration detector configured to detect the state of vibration of the optical column.

12. The optical equipment according to claim 8, wherein the vibration detector includes a distortion detector configured to detect the state of vibration of the optical column.

13. The optical equipment according to claim 8, wherein the vibration detector includes an optical detector configured to detect the status of vibration of the optical column by optically measuring a distance to the optical column.

14. The optical equipment according to claim 8, wherein the actuator units, when arranged between the lateral face of the optical column and the housing, slantingly extend from at least three different circumferential positions on the lateral faces of the optical column in at least three different directions to the housing.

15. The vibration control system according to claim 8, wherein each of the actuator units comprises the piezoelectric element including a plurality of the piezoelectric members arranged in parallel or in serial.

16. The vibration control system according to claim 8, wherein each of the actuator units comprises a plurality of piezoelectric elements arranged in parallel or in serial.

* * * * *